United States Patent
Lee

(10) Patent No.: US 8,711,575 B2
(45) Date of Patent: Apr. 29, 2014

(54) PRINTED CIRCUIT BOARD UNIT HAVING ROUTING UNIT MOUNTED THEREON AND COMPUTER DEVICE HAVING THE SAME

(75) Inventor: Do-kyun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 381 days.

(21) Appl. No.: 13/011,980

(22) Filed: Jan. 24, 2011

(65) Prior Publication Data

US 2012/0002389 A1    Jan. 5, 2012

(30) Foreign Application Priority Data

Jun. 30, 2010    (KR) .................. 10-2010-0062786

(51) Int. Cl.
    *H05K 1/11*    (2006.01)
(52) U.S. Cl.
    USPC ........... 361/803; 174/257; 361/736; 361/790; 361/792

(58) Field of Classification Search
    USPC ......... 174/250, 254, 257, 261; 361/736, 743, 361/784, 789, 790, 792, 803, 807–810, 812, 361/826, 827
    See application file for complete search history.

(56) References Cited

U.S. PATENT DOCUMENTS

| | | | | |
|---|---|---|---|---|
| 5,245,216 | A | * | 9/1993 | Sako .............................. 257/676 |
| 6,104,088 | A | * | 8/2000 | Hatano et al. ................. 257/698 |
| 7,989,929 | B2 | * | 8/2011 | Fjelstad et al. ................ 257/664 |
| 8,361,757 | B2 | * | 1/2013 | Huang et al. .................. 435/107 |
| 2003/0042585 | A1 | * | 3/2003 | Corisis et al. ................. 257/668 |
| 2004/0094328 | A1 | * | 5/2004 | Fjelstad et al. ................ 174/251 |

* cited by examiner

*Primary Examiner* — Hoa C Nguyen
(74) *Attorney, Agent, or Firm* — Stanzione & Kim, LLP

(57) ABSTRACT

A printed circuit board unit usable with a computer device includes a main board on which a first component and a second component are mounted on an upper surface, and a routing unit mounted on at least one of the upper surface and a lower surface of the main board and including a sub-wire forming at least part of a wire to transmit a data between the first component and the second component.

28 Claims, 10 Drawing Sheets

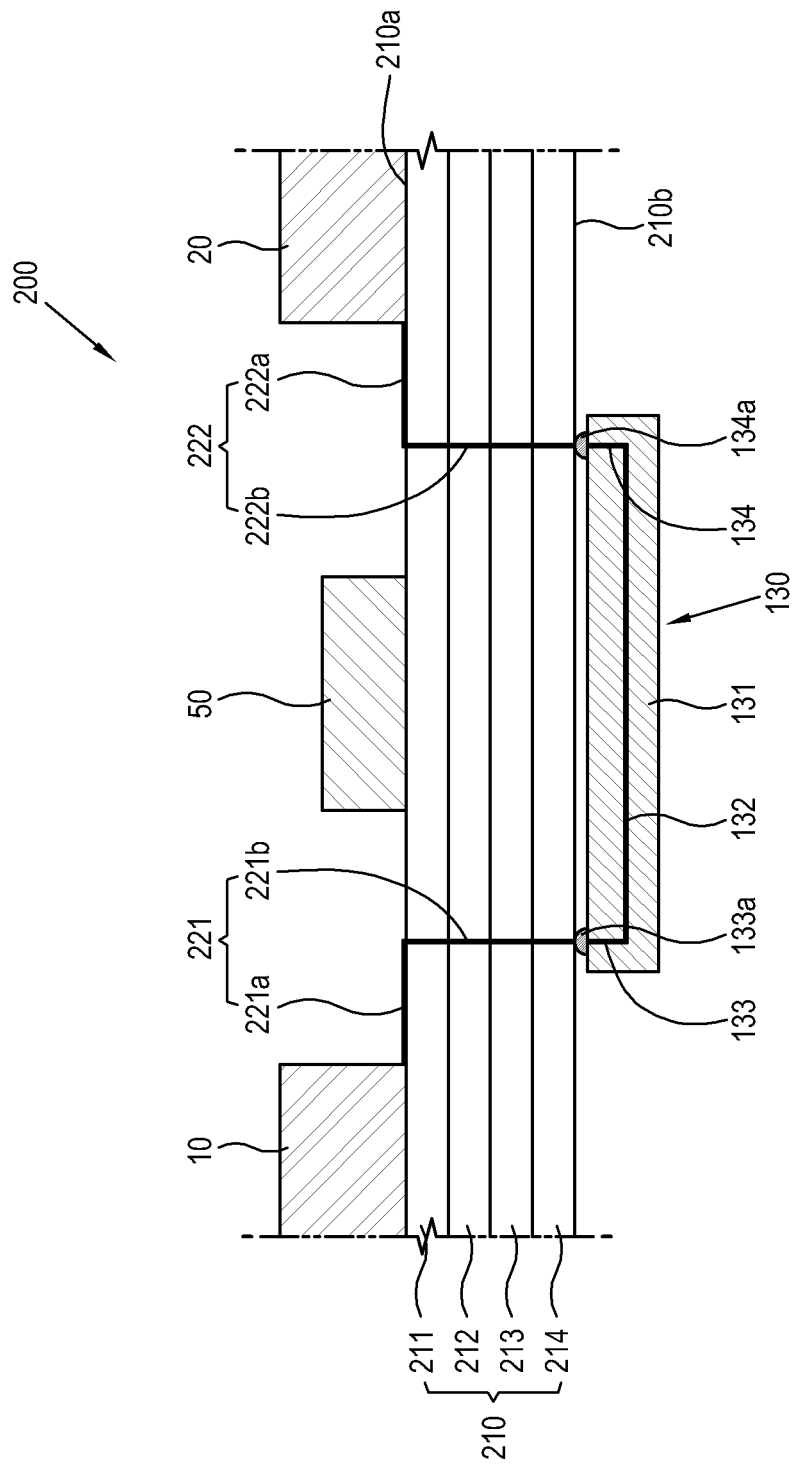

PRINTED CIRCUIT BOARD UNIT HAVING ROUTING UNIT MOUNTED THEREON AND COMPUTER DEVICE HAVING THE SAME

CROSS-REFERENCE TO RELATED APPLICATIONS

This application claims priority under 35 U.S.C. §119 from Korean Patent Application No. 10-2010-0062786, filed on Jun. 30, 2010 in the Korean Patent Office, the disclosure of which is incorporated herein in its entirety by reference.

BACKGROUND

1. Field of the Invention

Apparatuses and methods consistent with the exemplary embodiments relate to a printed circuit board unit on which a plurality of components are mounted and a computer device having the same, and more particularly, to a printed circuit board unit which is improved in wire structure to form a data transmission bus between the plurality of components and a computer device having the same.

2. Description of the Related Art

A computer device implements a variety of applications in an operating system to obtain user-desired data processing results. To this end, the computer device includes hardware installed therein, such as a central processing unit (CPU), a memory to store data, and a main board on which an option board corresponding to various functions to assist the CPU is mounted, e.g., a graphic card. Here, the main board of the computer device employs a multi-layer printed circuit board constituted by depositing a plurality of layers.

The multi-layer printed circuit board includes a plurality of components mounted thereon to perform various processes thereof, and a wire structure in which the components are connected with each other to form a data transmission bus is printed on an inner or outer surface of the printed circuit board.

In recent years, according to a tendency toward a smaller and lighter computer device, integration of components is improving and a multi-layer printed circuit board becomes smaller, and thus there occur limitations in designing a wire structure between a plurality of components. In particular, in the case of a memory interface formed in a parallel bus, a wire structure occupies a remarkably large printing area on the printed circuit board to include all signal lines such as a data, a clock, etc. In this case, an area for a wire structure associated with other components becomes smaller compared to a limited size of the printed circuit board. Further, another wire structure may be formed in a circuitous way. However, designing a printed circuit board becomes more complicated and difficult.

SUMMARY

Accordingly, one or more exemplary embodiments provide a printed circuit board unit in which a printed circuit board becomes small-sized and a wire structure to occupy a relatively smaller area on the printed circuit board is formed, and a computer device having the same.

Additional aspects and utilities of the present general inventive concept will be set forth in part in the description which follows and, in part, will be obvious from the description, or may be learned by practice of the present general inventive concept.

The foregoing and/or other features and embodiments of the present general inventive concept may be achieved by providing a printed circuit board unit usable with a computer device, the printed circuit board unit including a main board on which a first component and a second component are mounted on an upper surface, and a routing unit mounted on at least one of the upper surface and a lower surface of the main board and including a sub-wire forming at least part of a wire to transmit data between the first component and the second component.

The routing unit may include a sub-board which the sub-wire is formed on a surface or in.

The main board may be formed by depositing at least two layers including an uppermost first layer and a lowermost second layer.

The main board may include a first wire unit and a second wire unit which extend from the first component and the second component, respectively, by a predetermined distance, and the routing unit may be mounted on the main board so that the sub-wire connects the first wire unit and the second wire unit to each other.

The first wire unit and the second wire unit may be formed on an upper surface of the first layer, and the routing unit may be mounted between the first component and the second component on the upper surface of the first layer.

The printed circuit board unit may include a third wire unit insulated from the first wire unit and the second wire unit being formed on the upper surface of the first layer in an area in which the routing unit is mounted.

The first wire unit and the second wire unit may be formed to extend to a lower surface of the second layer from the first component and the second component, respectively, and the routing unit may be mounted on the lower surface of the second layer.

The printed circuit board unit may include a third component being mounted on the upper surface of the first layer between the first component and the second component.

The sub-wire may include a first terminal unit and a second terminal unit which are in contact with the first wire unit and the second wire unit, respectively, at both end portions.

The first terminal unit and the second terminal unit may include a soldering ball combined with the main board by welding.

The first component may include a random-access memory (RAM), and the second component includes a memory controller to control data loading and access to the RAM.

The foregoing and/or other features and embodiments of the present general inventive concept may also be achieved by providing a computer device including a first component, a second component performing data communication with the first component, and a printed circuit board unit on which the first component and the second component are mounted, the printed circuit board unit including a main board on which the first component and the second component are mounted on an upper surface, and a routing unit mounted on at least one of the upper surface and a lower surface of the main board and including a sub-wire forming at least part of a wire to transmit data between the first component and the second component.

The foregoing and/or other features and embodiments of the present general inventive concept may also be achieved by providing a printed circuit board unit usable with a computer device, the printed circuit board unit including a main board mounted with a first component and a second component, and a routing unit mounted on the main board between the first component and the second component, and including a sub wire unit formed therein to electrically connect the first component and the second component.

The sub wire unit may form a data transmission passage disposed on a straight line connecting the first component and the second component.

The routing unit may be disposed on a shortest line connecting the first component and the second component.

The first component may have a first side, the second component may have a second side facing the first side of the first component, and the routing unit may be disposed between the first side of the first component and the second side of the second component.

The printed circuit board unit may further include a first wire unit connected to the first component, and a second wire unit connected to the second component to be connected to the first wire unit though the sub wire unit of the routing unit.

The first wire unit may be extended from the first component toward the second component in a first direction, the second wire unit may be extended from the second component toward the first direction in a second direction, and the sub-wire unit may be disposed in a sub direction parallel at least one of the first direction and the second direction.

The first wire unit may be extended from the first component, the second wire unit may be extended from the second component, and the sub-wire unit is disposed in a direction parallel to at least one of the first wire unit and the second wire unit to connect the first wire unit and the second wire unit.

The sub wire unit may be formed in the routing unit in a direction parallel to at least one of the first wire unit and the second wire unit.

The sub wire unit may be disposed on a straight line on which at least one of the first wire unit and the second wire unit is disposed.

The first component may include a first side from which the first wire unit is disposed, the second component may include a second side from which the second wire unit is disposed, and the first side of the first component may be disposed to face the second side of the second component.

The sub wire unit may be disposed in the routing unit on a straight line between the first side of the first component and the second side of the second component.

The printed circuit board unit may further include one or more solder balls disposed between the sub wire unit and at least one of the first wire unit and the second wire unit, and the routing unit may be spaced apart from the main board by a thickness of the solder balls to provide a second data transmission passage between a third component and a fourth component which are disposed on the main board.

The routing unit may include a body and terminals exposed from the body to the main board, and the sub wire unit may be formed inside the body and connected between the terminals.

The body of the routing unit may have a thickness between the sub wire unit and the main board as an insulation layer.

The routing unit may form a space with the main board as a second data transmission passage between a third component and a fourth component.

The data transmission passage may be disposed in a direction having an angle with a direction of the second transmission passage.

The routing unit may include a body in which the sub wire unit is formed, the sub wire unit having a conductive line formed inside the body and terminals connected both ends of the conductive line and exposed from the body to an outside of the body, and the terminals may be connected to the corresponding first and second components.

The conductive line may be disposed parallel to a straight line connecting the first component and the second component, and the terminals may be extended from the conductive line toward terminals of the main board connected to the first component and the second component.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which:

FIG. 7 is a cross-sectional view taken along a line II-II in the printed circuit board unit of FIG. 6.

DETAILED DESCRIPTION OF THE EMBODIMENTS

Figure 1:
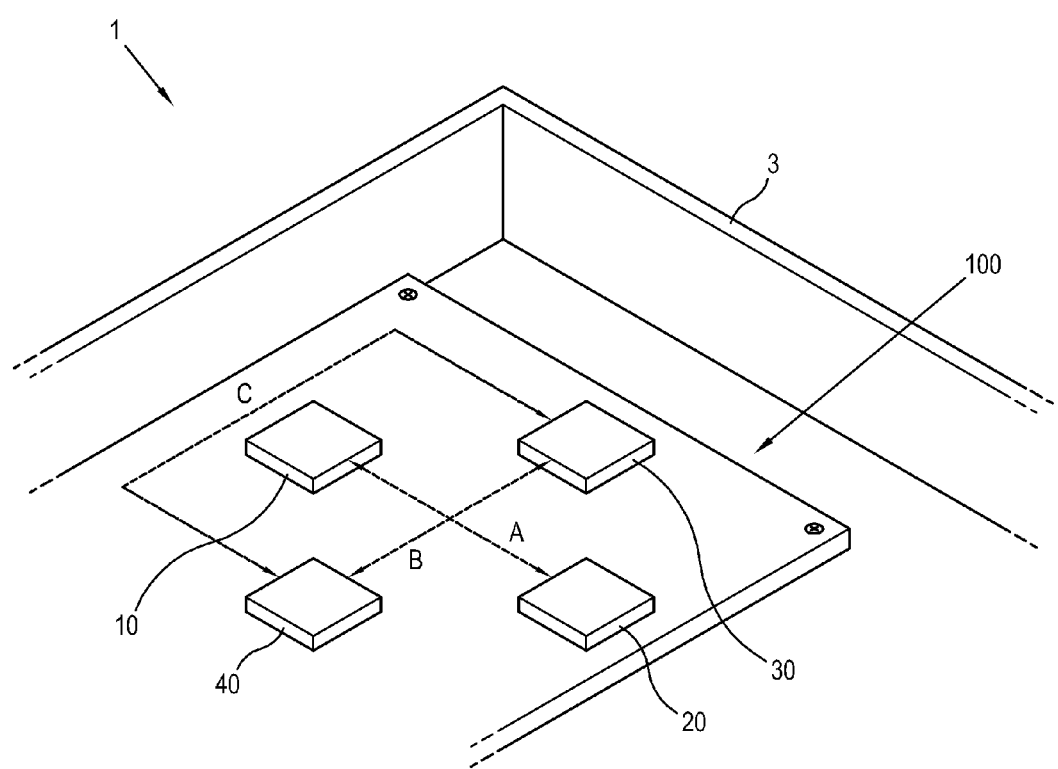
FIG. 1 is a perspective view illustrating an example of constituting a wire in a computer device according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a perspective view illustrating a computer device 1 according to an exemplary embodiment of the present general inventive concept. The computer device 1 is illustrated as an example of an electronic apparatus. However, the present general inventive concept is not limited thereto. The electronic apparatus may be the computer device 1 or other type of apparatuses as explained later.

As illustrated in FIG. 1, the computer device 1 may include a housing 3, components 10, 20, 30, and 40 to implement various functions needed for operation of the computer device 1, and a printed circuit board unit 100 installed in the housing 3 and on which the components 10, 20, 30, and 40 are mounted.

The computer device 1 may be realized as various types corresponding to a variety of user's demands, and the scope of the present embodiment may be applied to various types of a computer device 1. For example, the computer device 1 may be realized as desktop and laptop computers or as a pad having a display panel (not illustrated). It is possible that the computer device 1 may be a mobile device having components to communicate with other apparatus using a wired or wireless communication line. It is also possible that the computer device 1 may be an audio and/or video image processing apparatus, a graphic or text processing apparatus, a data storing and reproducing apparatus, a data processing apparatus, etc. Since the functions and structures of the electronic apparatus, that is, the computer device 1, are well known, details thereof will be omitted.

The components 10, 20, 30, and 40 performs unique functions, respectively, and the plurality of components 10, 20, 30, and 40 transmit data, information, clock, etc. through data communication with each other and accordingly perform preset processes based on this. That is, a final operation and operation processes of the computer device 1 are performed by inter-linking operations of the components 10, 20, 30, and 40, and the components 10, 20, 30, and 40 are connected with each other to enable data communication to this end. At least one of the components 10, 20, 30, and 40 may be an interface apparatus to communicate with other components or an external apparatus.

The components 10, 20, 30, and 40 may be designated variously depending on a basic operation of the computer device 1 and whether to expand additional functions thereof. For example, the components 10, 20, 30, and 40 may include a central processing unit (CPU) for central operation processing, a memory module to store data such as a random-access memory (RAM) or a read-only memory (ROM), a memory controller interfacing the CPU and the memory module and controlling data loading and access to the memory module, and chipsets with various functions.

The printed circuit board unit 100 is combined with the housing 3 via a screw or the like, and the plurality of components 10, 20, 30, and 40 are mounted on an upper surface. The printed circuit board unit 100 is formed with a wire printed on the board to connect the components 10, 20, 30, and 40 to enable communication. Since the various components 10, 20, 30, and 40 are mounted on the printed circuit board 100, a wire to connect the components 10, 20, 30, and 40 becomes complicated. Thus, designing a wire effectively on the printed circuit board unit 100 is important to make the printed circuit board unit 100 smaller and to reduce costs.

For example, a first component 10, a second component 20, a third component 30, and a fourth component 40 are mounted on the upper surface, wherein the first component 10 and the second component 20 communicate with each other, and the third component 30 and the fourth component 40 communicate with each other.

When the first component 10 and the second component 20 are provided as a memory controller and an RAM, respectively, since a memory interface applied to the computer device 1 is a parallel bus, in the case of a dual channel, a wire between the components 1 and the component 20 needs about 250 signal lines.

When an area occupied by a wire structure between the first component 10 and the second component 20 is relatively large in the printed circuit board unit 100, limitations happen in design when forming a wire associated with the other components 30 and 40. When the printed circuit board unit 100 is manufactured to be smaller and thinner, the limitations becomes serious.

Meanwhile, a wire between the first component 10 and the second component 20 may be formed on the upper surface of the printed circuit board unit 100 along a path A.

At this point, when forming a wire between the third component 30 and the fourth component 40, due to the wire along the path A formed between the first component 10 and the second component 20, a wire along a path B is not formed on the upper surface of the printed circuit board 100. In order to form a wire between the third component 30 and the fourth component 40 along the path B, a layer in which the wire is formed may need to be additionally deposited on the printed circuit board unit 100, thereby increasing manufacturing costs and thickness of the printed circuit board 100.

When a wire are formed between the third component 30 and the fourth component 40 along a path C, the wire is allowed to be formed on the upper surface of the printed circuit board unit 100. However, the wire may extend excessively in length and undergo interference by separate components and wires not shown in FIG. 1.

Hereinafter, the printed circuit board unit 100 according to the present embodiment to solve the aforementioned problems is described with reference to FIG. 2.

Figure 2:
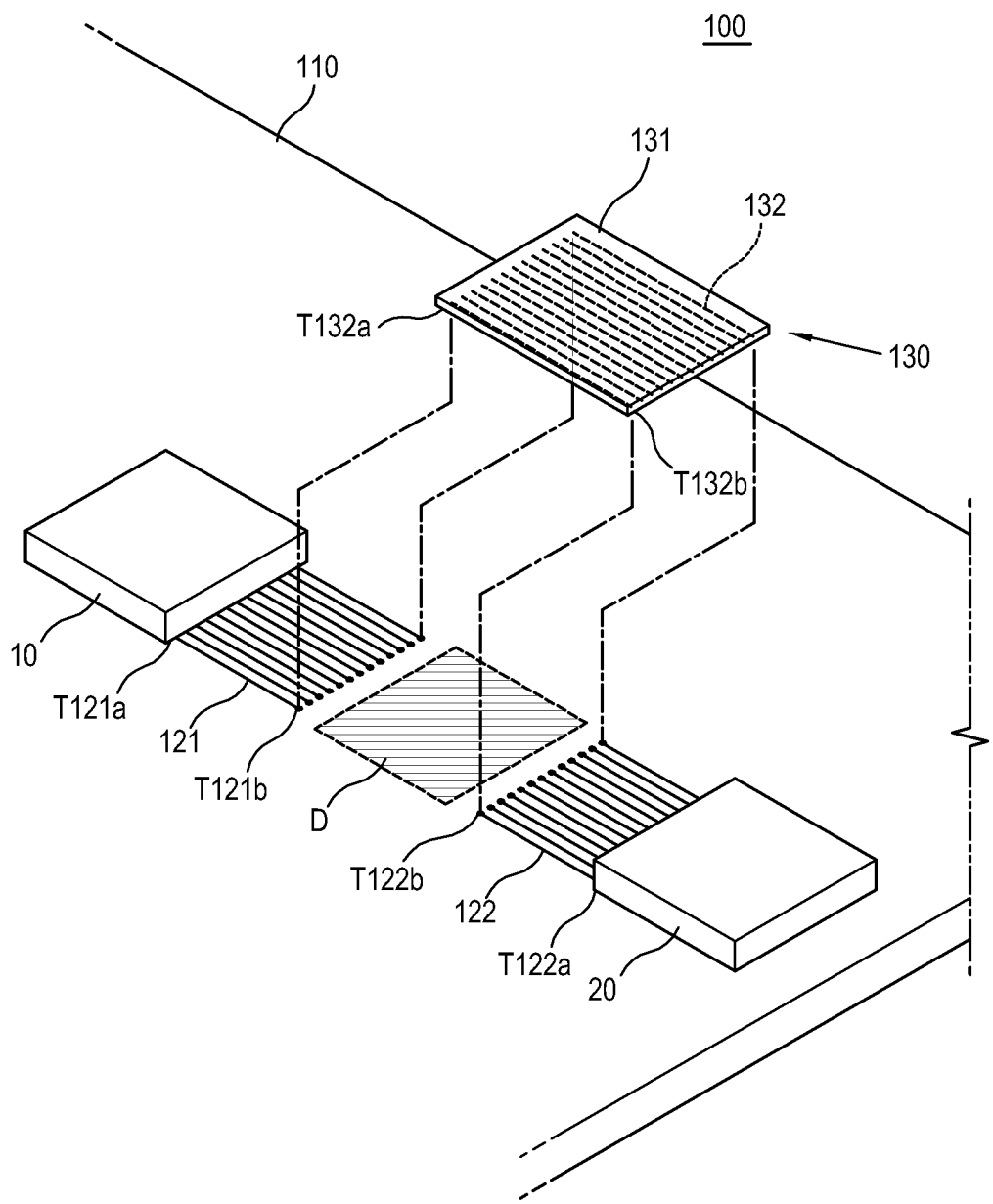
FIG. 2 is a perspective view of a main part of a printed circuit board unit in the computer device of FIG. 1.

FIG. 2 is a perspective view of a main part of the printed circuit board unit 100 according to the present embodiment.

As illustrated in FIG. 2, the printed circuit board unit 110 includes a main board 110 on which the components 10 and 20 are mounted on the upper surface and a routing unit 130 constituting at least part of the wire between the components 10 and 20 to form a data transmission bus. The present embodiment has been described with the routing unit 130 forming the wire between the first component 10 and the second component 20, but is not limited thereto. The routing unit 130 may be disposed in a wire diverging area among three or more components or in various positions according to designs.

The main board 110 is formed by printing a wire on an insulating layer such as plastic resin. Considering an arrangement of the components 10 and 20 and the wire on the main board 110, these elements are not easy to be provided on a single layer, and thus the main board 110 may be formed of a plurality of layers according to an arrangement of the components 10, 20, 30, and 40 and the wire. The present embodiment is described with the main board 110 in a multi-layer, but the scope of the present embodiment is not limited thereto.

When the main board 110 is provided as a multi-layer, at least one layer is deposited between a first layer and a second layer. Here, an upper surface of the main board 110 on which the components 10 and 20 are mounted is generally an upper surface of the first layer, and a lower surface of the main board 110 is generally a lower surface of the second layer.

A first wire unit 121 extending from the first component 10 by a predetermined distance and a second wire unit 122 extending from the second component 20 by a predetermined distance are formed on the upper surface of the main board 110.

The first wire unit 121 and the second wire unit 122 include a plurality of signal lines corresponding to each other. The respective signal lines transmit signals with various characteristics and standards needed for processing operations of the components 10 and 20 and may be modified variously in design according to the components 10 and 20.

An area D formed between the first wire unit 121 and the second wire unit 122 on the upper surface of the main board 110 is an area in which a wire structure connecting the first wire unit 121 and the second wire unit 122 is not formed.

To enable data communication between the first component 10 and the second component 20, an end portion of the first wire unit 121 and an end portion of the second wire unit 122, i.e., the respective signal lines (or conductive lines) which the first wire unit 121 and the second wire unit 122 include, are connected correspondingly to each other. Thus, in the present embodiment, applying the routing unit 130 to the main board 110 enables such connection.

The first wire unit 121 has a one end T121a extended from a connection terminal of a circuit of the component 10, the other end T121b as a first wire unit terminal, and conductive lines between the ends (or terminals) T121a and T121b. The second wire unit 122 has a one end T122a extended from a connection terminal of a circuit of the component 20, the other end T122*b* as a second wire unit terminal, and conductive lines between the ends (or terminals) T122*a* and T122*b*. The terminals T121*b* and T122*b* are formed on the upper surface of the main board 110 of the printed circuit board 100 and spaced apart from each other and electrically disconnected to each other.

It is possible that at least one of the first and second wire units 121 and 122 can be formed in a layer of the main board 110 of the printed circuit board 100, and that the terminals T121*b* and T122*b* can be connected to the corresponding lines of the first and second wire units 121 and 122, respectively, and can be formed on a surface of the main board 110 of the printed circuit board 100, for example, a surface of the layer, to be exposed to an outside thereof.

The sub wire unit 132 may include sub terminals T132*a* and T132*b* to be connected to the corresponding terminals T121*b* and T122*b*, respectively, and conductive lines formed between the sub terminals T132*a* and T132*b*. The sub terminal T132*a* is connected to the corresponding terminal T121*b*, and the sub terminal T132*b* is connected to the corresponding terminal T122*b*.

The conductive lines of the first wire unit 121 are disposed in a first direction from the component 10 toward the component 20, and the conductive lines of the second wire unit 122 are disposed in a second direction from the component 20 toward the component 10. The length of the conductive lines of the first wire unit 121 and the second wire unit 122 may be a length formed along a straight line connecting the components 10 and 20. However, the present general inventive concept is not limited thereto. The lengths of the conductive lines of the first wire unit 121 and/or the second wire unit 122 may be the same. It is possible that the lengths of the conductive lines of the first and second wire units 121 and 122 may be different from each other.

It is possible that the conductive lines are disposed in a parallel direction, and the conductive lines are disposed in different direction according to locations or arrangements of one or more components of the printed circuit board 100. The conductive lines of the first wire unit 121 are disposed in a first direction from the component 10 toward the component 20, and the conductive lines of the second wire unit 122 are disposed in a second direction from the component 20 toward the component 10.

The conductive lines of the sub wire unit 132 are disposed in the same direction of at least one of the first wire unit 121 and the second wire unit 122. However, the present general inventive concept is not limited thereto. The conductive lines of the sub wire unit 132 may be disposed in a direction different from a direction of at least one of the conductive lines of the first wire unit 121 and the second wire unit 122.

The routing unit 130 is mounted on the upper surface of the main board 110 to connect the first wire unit 121 and the second wire unit 122 to communicate with each other. The routing unit 130 includes a routing unit body 131 and a sub-wire unit 132 formed in the routing unit body 131.

The routing unit body 131 is not limited in shape, material, etc., but may be provided as a sub-board with the sub-wire 132 formed on a surface or therein. The routing unit body 131 is mounted on the upper surface of the main board 110 and has a proper size so that the first component 10 and the second component 20 interfere with the routing unit body 131.

The sub-wire unit 132 connects the first wire unit 121 and the second wire unit 122 to communicate with each other, with the routing unit body 131 being mounted on the main board 110. To this end, the sub-wire unit 132 includes signal lines corresponding to the respective signal lines included in the first wire unit 121 and the second wire unit 122. Although a position of the sub-wire unit 132 in the routing unit body 131 is not limited, the sub-wire unit 132 may be formed in the routing unit body 131 to be insulated from a component installed on the main board 110.

Figure 3:
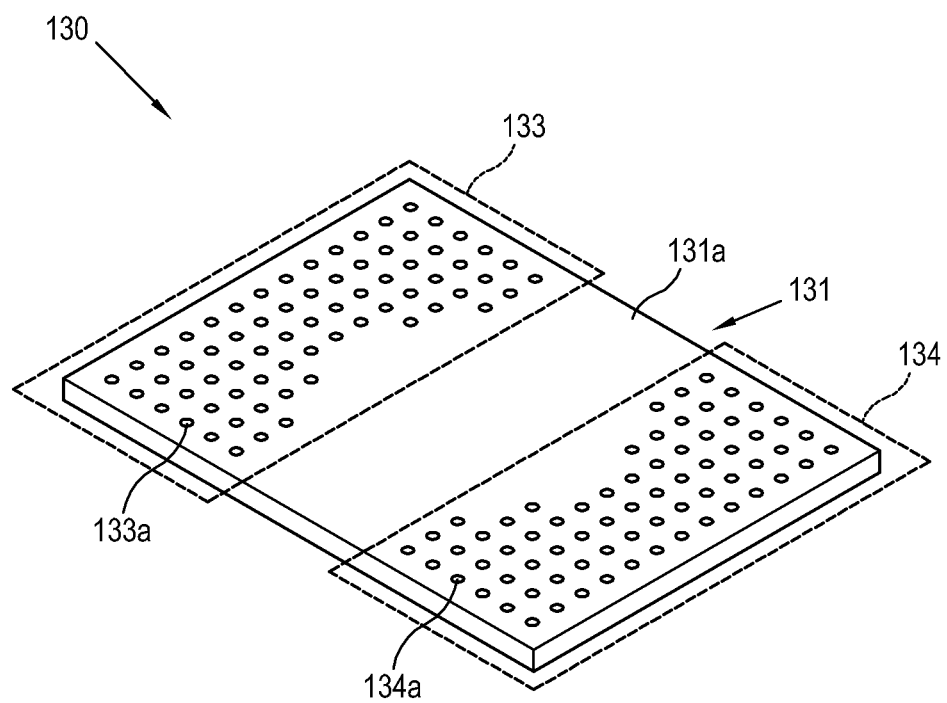
FIG. 3 is a perspective view illustrating a routing unit in the printed circuit board unit of FIG. 2.

FIG. 3 is a perspective view illustrating a lower surface of the routing unit 130.

As illustrated in FIG. 3, the routing unit 130 includes a first terminal unit 133 (or sub terminal T132*a* of FIG. 2) and a second terminal unit 134 (or sub terminal T132*b* of FIG. 2) on the lower surface which are in contact with the first wire unit 121 and the second wire unit 122, respectively. Here, the lower surface of the routing unit 130 denotes a surface facing the main board 110 when the routing unit 130 is mounted on the main board 110.

The first terminal unit 133 and the second terminal unit 134 are connected by the conductive lines of the sub-wire unit 132. The first terminal unit 133 and the second terminal unit 134 are in contact with the end portion of the first wire unit 121 and the end portion of the second wire unit 122, respectively, when the routing unit body 131 is mounted on the main board 110. Accordingly, a data communication bus is constituted by the first wire unit 121, the first terminal unit 133, the sub-wire unit 132, the second terminal unit 134, and the second wire unit 122 between the first component 10 and the second component 20.

The first terminal unit 133 and the second terminal unit 134 may include solder balls 133*a* and 134*a* to be combined to the main board 110 by a welding or connecting method, so that the routing unit 130 is securely combined with the main board 110. It is possible that the first terminal unit 133 and the second terminal unit 134 include an electrode as a connecting component, and a combining component, such as a hook, combined with the main board 110 or a coupling component, such as a screw and a rivet, may be formed on the routing unit body 131 to be electrically connected to the corresponding first and second wire units 121 and 122, respectively. However, the present general inventive concept is not limited thereto. It is possible that the first terminal unit 133 and the second terminal unit 134 do not include the solder balls 133*a* and 134*a*, but are connected to the first wire unit 121 and the second wire unit 122 without the solder balls 133*a* and 134*a*. In this case, it is possible that the first terminal unit 133 (or sub terminal T132*a* of FIG. 2) and the second terminal unit 134 (or sub terminal T132*b* of FIG. 2) may have solder balls exposed from the lower surface 131*a* of the routing unit 131 to be connected to the first wire unit 121 and the second wire unit 122.

Figure 4:
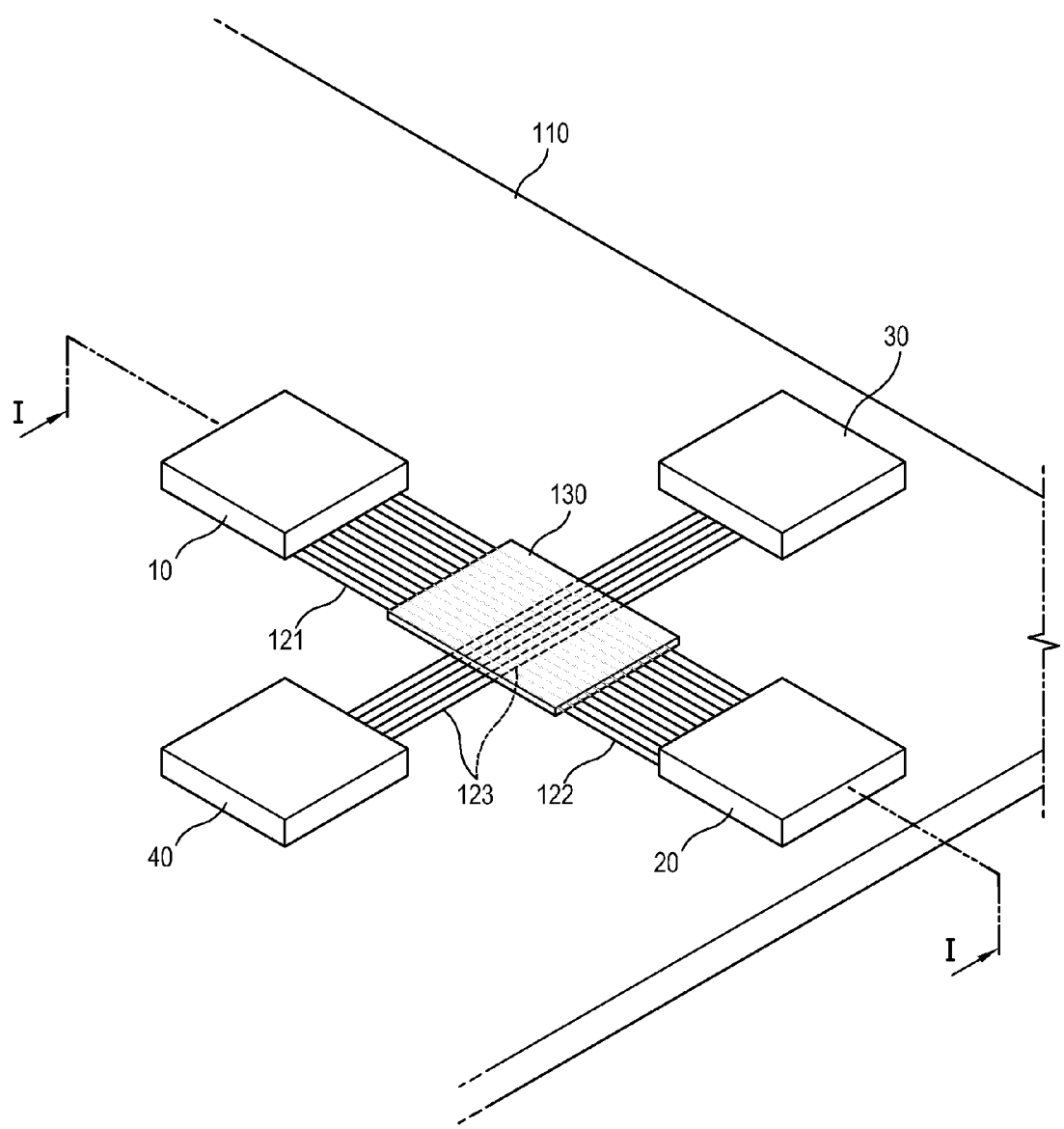
FIG. 4 is a perspective view illustrating an example of constituting a wire unit between respective components in the printed circuit unit of FIG. 2.
Figure 5:
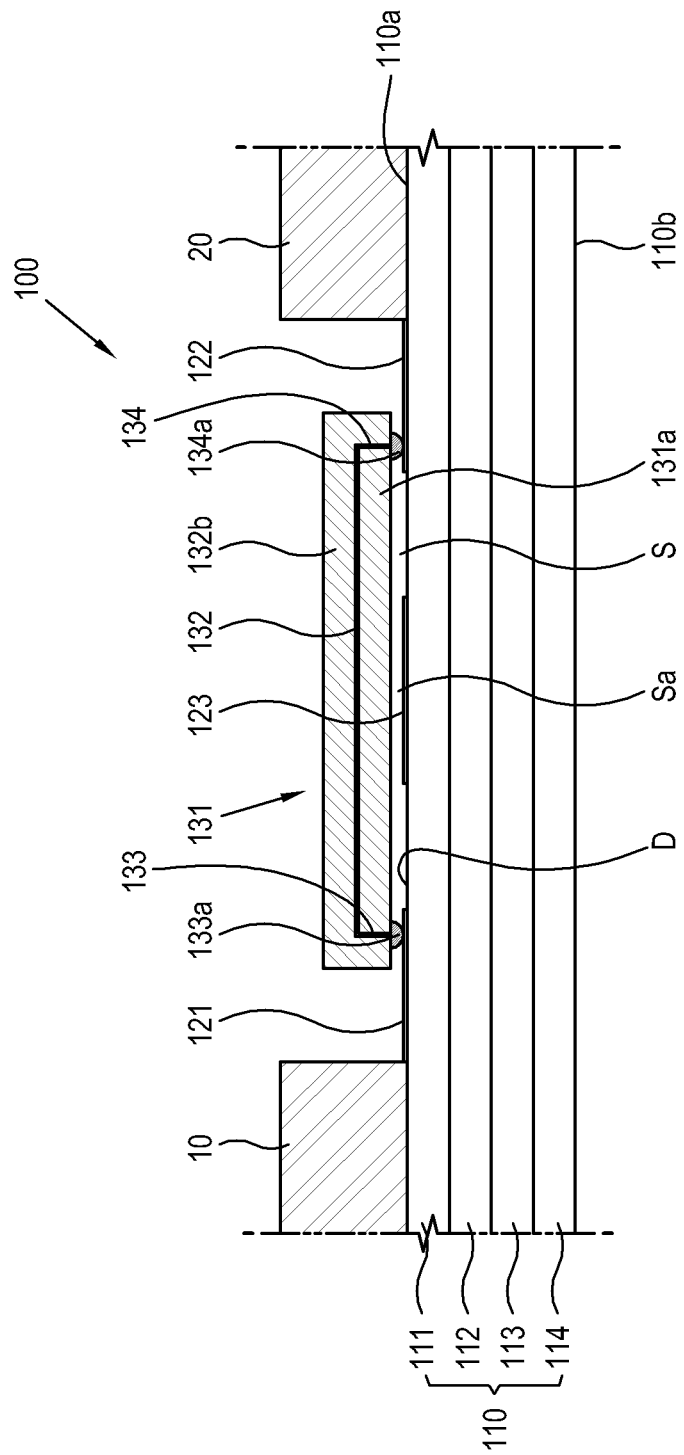
FIG. 5 is a cross-sectional view taken along a line I-I in the printed circuit board unit of FIG. 4.

FIG. 4 is a perspective view of the printed circuit board unit 100 with the routing unit 130 being mounted on the main board 110, and FIG. 5 is a cross-sectional view taken along a line I-I in FIG. 4.

As illustrated in FIGS. 4 and 5, when the main board is formed of a plurality of layers, for example, a first layer 111, a second layer 112, a third layer 113, and a fourth layer 114 deposited in order from a bottom to a top, the components 10, 20, 30, and 40 are mounted on an upper surface of the first layer 111.

As the routing unit 130 is mounted on the first layer 111, the sub-wire unit 132 connects the first wire unit 121 and the second wire unit 122 to communicate with each other. Accordingly, a data communication bus is formed between the first component and the second component 20.

In this state, constituting a communication bus between the third component 30 and the fourth component is considered. An area D in which a wire structure connecting the first wire unit 121 and the second wire unit 122 is not formed owing to the routing unit 130 happens between the first component 10 and the second component 20 on the upper surface 110a of the first layer 111 (Refer to FIG. 2) opposite to the surface 110b of the fourth layer 114.

Thus, a third wire unit 123 connecting the third component 30 and the fourth component 40 to communicate with each other may possibly be formed to detour the first component 10 or the second component 20 or to pass through the area D between the first wire unit 121 and the second wire unit 122 without adding the additional layers 111, 112, 113, and 114 to the main board 110.

Since the third wire unit 123 is formed on the upper surface of the first layer 111 and the sub-wire 132 is formed on the routing unit body 131 to be spaced from the third wire unit 123, the communication bus between the first component 10 and the second component 20 and the communication bus between the third component 30 and the fourth component 40 are insulated from each other.

The third wire unit 123 may have conductive lines passing under the routing unit 130 and disposed along a line having an angle with a direction of at least one of the first wire unit 121 and the second wire unit 122.

The conductive lines of the sub wire unit 132 may include sub conductive lines 133 and 134, and solder balls 133a and 134a maybe formed on distal ends of the sub conductive lines 133 to be connected to the corresponding first and second wire units 121 and 122.

The routing unit body 131 of the routing unit 130 may include layers 132a and 132b disposed below and above the conductive lines of the sub wire unit 132. The layers 132a and 132b may be used as an insulation layer.

The routing unit 130 may have a space S with the upper surface 110 of the main board 110. It is possible that the space S may be narrow as another space Sa between the third wire unit 123 and the routing unit 130. However, the present general inventive concept is not limited thereto. When the layer 131a of the routing unit 130 is disposed on the third wire unit 123 as an insulation layer or a protection layer, it is possible that the space Sa may becomes zero so that the layer 131a can contact the third wire unit 123. It is also possible that the space Sa may not be zero to provide a heat dissipation path to an outside thereof.

As described above, according to the present embodiment, applying the routing unit 130 to the main board 110 enables the main board 110 to be smaller and thinner and facilitates designs of the components 10, 20, 30, and 40 and the wires.

Meanwhile, although the aforementioned embodiment has been described with the routing unit 130 mounted on the upper surface of the first layer 111 on which the component 10, 20, 30, and 40 are mounted, the scope of the present embodiment is not limited thereto. A structure in which a routing unit 130 is mounted in a different way from that in the first embodiment is referred to as a second exemplary embodiment and described with reference to FIGS. 6 and 7.

Figure 6:
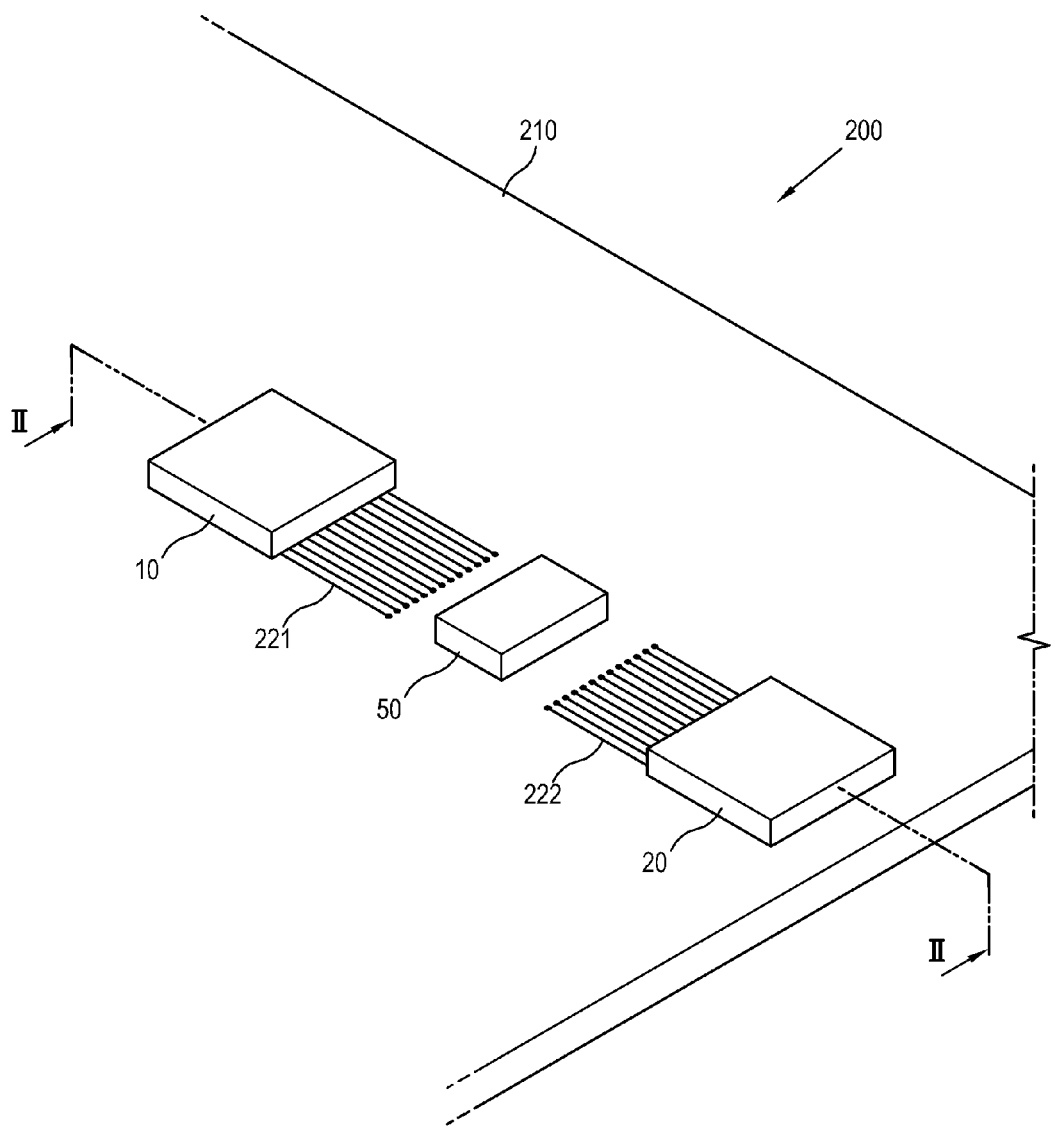
FIG. 6 is a perspective view of a printed circuit board unit according to an exemplary embodiment of the present general inventive concept.

FIG. 6 is a perspective view of a printed circuit board unit 200 with the routing unit 130 being mounted on a main board 210 according to a second exemplary embodiment, and FIG. 7 is a cross-sectional view taken along a line II-II in FIG. 6.

As illustrated in FIGS. 6 and 7, the printed circuit board unit 200 includes a main board 210 of a plurality of layers, for example, a first layer 211, a second layer 212, a third layer 213, and a fourth layer 214 deposited in order from a bottom to a top, and a routing unit 130 mounted on the main board 210.

A first component 10 and a second component 20 are mounted on an upper surface 210 of the first layer 211 of the main board 210. However, a fifth component 50 may be mounted between the first component 10 and the second component 20 on the upper surface of the first layer 211 according to a designing type. In this case, mounting the routing unit 130 on the upper surface of the first layer 211 as in the first embodiment may be difficult.

Thus, a first wire unit 221 and a second wire unit 222 extending from the first component 10 and the second component 20, respectively, extend to a lower surface 210b of the fourth layer 214 through the first layer 211, the second layer 212, and the third layer 213.

The routing unit 130 is mounted on the lower surface 210b of the fourth layer 214, and so a first terminal unit 133 and a second terminal unit 134 are in contact with the first wire unit 221 and the second wire unit 222 which extend to the lower surface 210b of the fourth layer 214, respectively. Accordingly, the first wire unit 221 and the second wire unit 222 are connected by a sub-wire unit 132 to communicate with each other. The embodiment is applied to a structure of the routing unit 130, and thus description thereof is omitted.

The first wire unit 221 may include a first conductive line portion 221a formed in or on the first layer 211 and a second conductive line portion 221b formed through the first, second, third, and/or fourth layers 211, 212, 213, and/or 214 to be connected to the sub wire unit 132 through a connecting element, for example, the solder balls 133a. The second wire unit 222 may include another first conductive line portion 222a formed in or on the first layer 211 and another second conductive line portion 222b formed through the first, second, third, and/or fourth layers 211, 212, 213, and/or 214 to be connected to the sub wire unit 132 through a connecting element, for example, the solder balls 134a.

The second conductive line portions 221b and 222b may be a straight line. However, the present general inventive concept is not limited thereto. It is possible that the second conductive line portions 221b and 222b may be a step-shaped line in which the second conductive line portions 221b and 222b may have lines formed in the corresponding layers and connecting lines formed between the adjacent layers to connect the lines of the corresponding layers.

Figure 8A:
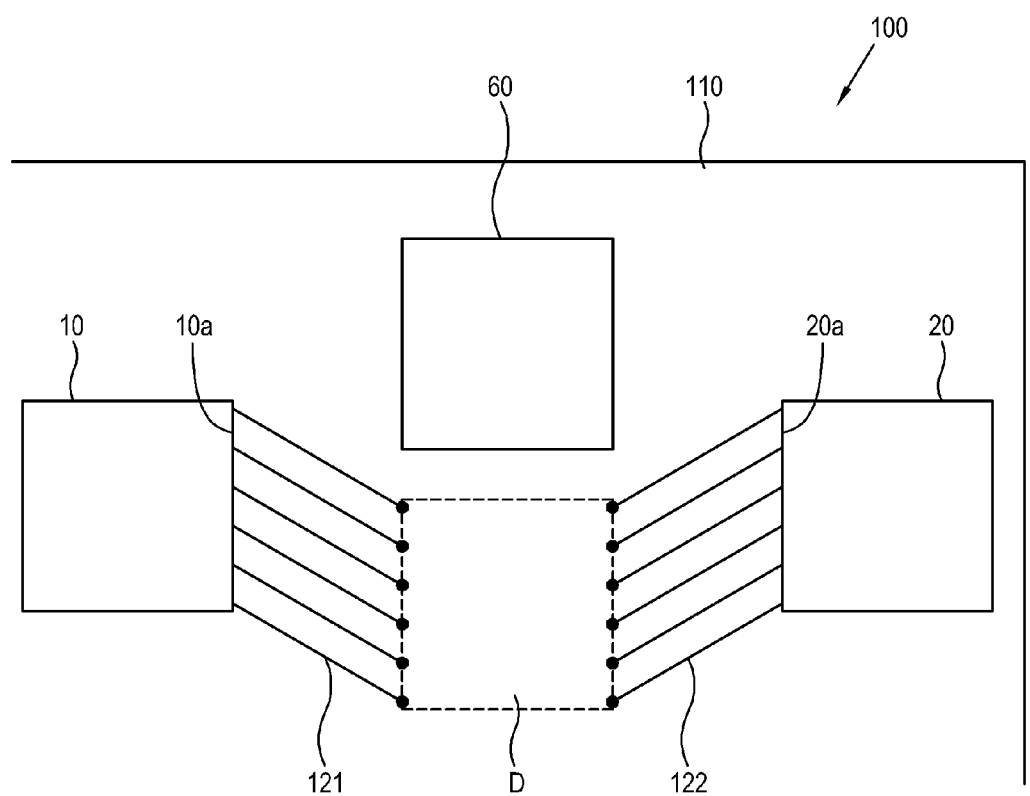
FIGS. 8A, 8B, and 8C are views illustrating a printed circuit board according to an embodiment of the present general inventive concept.

As illustrated in FIG. 8A, when a sixth component 60 may be disposed between the components 10 and 20, the first wire unit 121 may be extended from a side 10a of the component 10 other than sides of the component 10 disposed away from the sixth component 60, and the second unit 122 may be extended from a side 20a of the component 20 other than sides of the component 20 disposed away from the sixth component 60. The sides 10a and 20a may face the sixth component 60 to provide a relatively short connection between the components 10 and 20. In this case, it is possible that directions of the first and second wire units 121 and 122 may not be parallel.

Figure 8B:
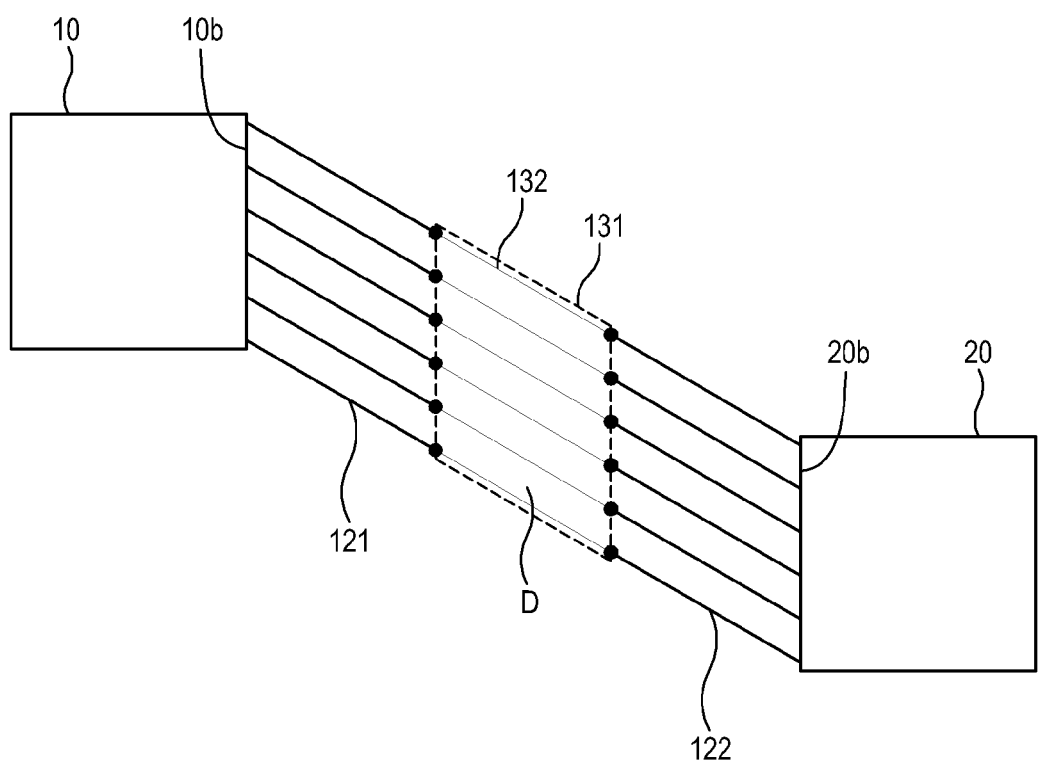

As illustrated in FIG. 8B, the first and second wire units 121 and 122 may be extended from sides 10b and 20b of the components 10 and 20, respectively, and may be disposed parallel to each other. Here, the sides 10b and 20b are disposed to face each other through the area D. The components 10 and 20 are not disposed on a line as illustrated in FIG. 8A.

Figure 8C:
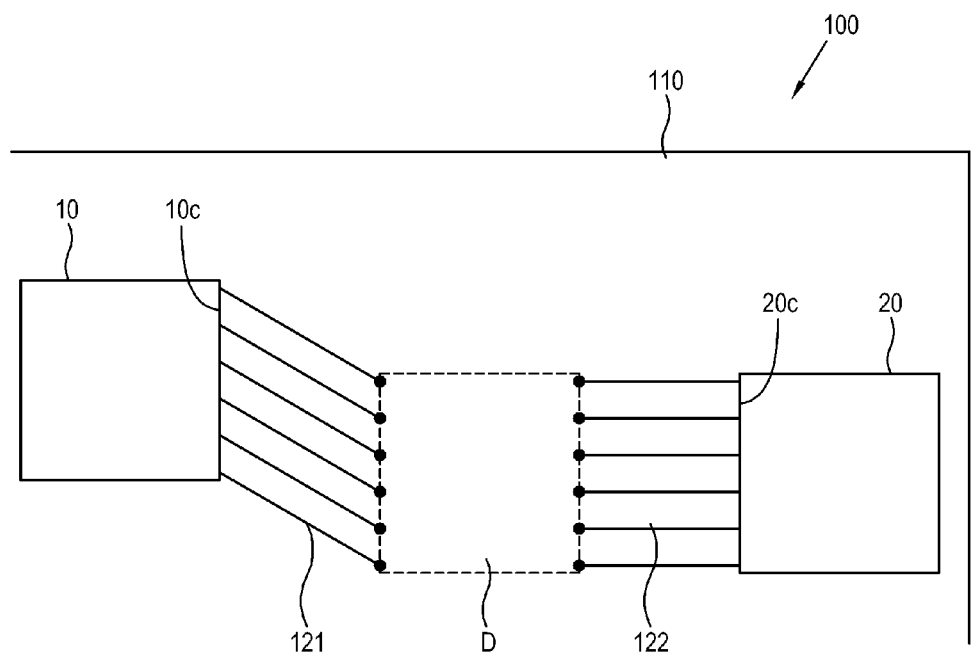

As illustrated in FIG. 8C, the components 10 and 20 are not disposed on a line as illustrated in FIG. 8A or 8B. The first wire unit 121 may be extended from a side 10c of the component 10 in a direction which is not perpendicular to the side 10C, and the second wire unit 122 may be extended from a side 20c of the component 20 in a direction which is perpendicular to the side 20C of the component 20.

The routing unit 130 may be another component formed with a circuit (not illustrated in drawings) connected to the conductive line of the sub wire unit 132. In this case, the circuit may be formed between the layers 131 and a 131b of the routing unit 130 to perform a function of the another component. The circuit may be a switching circuit to turn on or off the corresponding connective lines according to a characteristic of data transmitting through the conductive lines or according to a selection of the conductive lines through the circuit by a user. It is possible that the circuit processes data transmitted from one end of the sub wire unit 130 and then transmits the processed data to the other end of the sub wire unit 130.

As described above, according to the present embodiment, the routing unit 130 may be selectively mounted on an upper or lower surface of the main board 210 corresponding to a structure design of the printed circuit board 200.

According to the present embodiment, a routing unit having a sub-wire to form at least part of a wire unit between a first component and a second component is formed on a main board, thereby facilitating design of a wire structure without enlarging the main board or additionally depositing a layer on the main board.

Further, a multi-layer printed circuit board and a computer device using the same may become smaller and lighter, and manufacturing costs may decrease.

In addition, the routing unit is allowed to be selectively mounted on an upper or lower surface of the main board corresponding to a position of other components mounted and a position of a wire structure on the main board, thereby facilitating design of the main board.

Finally, a soldering ball is applied to the routing unit, and accordingly the routing unit is easily and securely mounted on the main board by welding.

Although a few exemplary embodiments of the present general inventive concept have been shown and described, it will be appreciated by those skilled in the art that changes may be made in these exemplary embodiments without departing from the principles and spirit of the general inventive concept, the scope of which is defined in the appended claims and their equivalents.

What is claimed is:

1. A printed circuit board unit usable with a computer device, the printed circuit board unit comprising:
   a main board on which a random-access memory (RAM) and a memory controller are mounted on an upper surface thereof, the memory controller configured to control data loading and access to the RAM; and
   a routing unit mounted on a lower surface of the main board opposite the upper surface, and comprising a sub-wire unit printed on a surface of a sub-board or in the sub-board, the sub-wire unit forming at least a portion of a wire to transmit a data between the RAM and the memory controller.

2. The printed circuit board unit according to claim 1, wherein the main board is formed by depositing at least two layers, and the at least two layers comprise an uppermost first layer and a lowermost second layer.

3. The printed circuit board unit according to claim 2, wherein:
   the main board comprises a first wire unit and a second wire unit which extend from the RAM and the memory controller, respectively, by a predetermined distance; and
   the routing unit is mounted on the main board so that the sub-wire unit connects the first wire unit and the second wire unit to each other.

4. The printed circuit board unit according to claim 3, wherein:
   the first wire unit and the second wire unit are formed on an upper surface of the first layer; and
   the routing unit is mounted between the RAM and the memory controller on a lower surface of the second layer opposite the upper surface of the first layer.

5. The printed circuit board unit according to claim 4, further comprising:
   a third wire unit insulated from the first wire unit and the second wire unit and formed on the lower surface of the second layer in an area in which the routing unit is mounted.

6. The printed circuit board unit according to claim 3, wherein:
   the first wire unit and the second wire unit are formed to extend to a lower surface of the second layer from the RAM and the memory controller, respectively; and
   the routing unit is mounted on the lower surface of the second layer.

7. The printed circuit board unit according to claim 6, wherein a first component is mounted on the upper surface of the first layer between the RAM and the memory controller.

8. The printed circuit board unit according to claim 3, wherein the sub-wire unit comprises a first terminal unit and a second terminal unit which are in contact with the first wire unit and the second wire unit, respectively, at both end portions.

9. The printed circuit board unit according to claim 1, wherein the routing unit comprises soldering balls configured to be combined with the main board by welding.

10. A computer device comprising:
    a RAM;
    a memory controller performing data communication with the RAM and configured to control data loading and access to the RAM; and
    a printed circuit board unit on which the RAM and the memory controller are mounted,
    the printed circuit board unit comprising:
    a main board on which the RAM and the memory controller are mounted on an upper surface thereof; and
    a routing unit mounted on a lower surface of the main board and comprising a sub-wire unit printed on a surface of a sub-board or in the sub-board, the sub-wire unit forming at least a portion of a wire to transmit a data between the RAM and the memory controller.

11. A printed circuit board unit usable with a computer device, the printed circuit board unit comprising:
    a main board mounted with a RAM and a memory controller on a first surface; and
    a routing unit mounted on the main board between the RAM and the memory controller on a second surface opposite the first surface, and including a sub wire unit printed on a surface of a sub-board or in the sub-board, the sub-wire unit being formed therein to electrically connect the RAM and the memory controller.

12. The printed circuit board unit of claim 11, wherein the sub wire unit forms a data transmission passage disposed on a straight line connecting the RAM and the memory controller.

13. The printed circuit board unit of claim 11, wherein the routing unit is disposed on a shortest line connecting the RAM and the memory controller.

14. The printed circuit board unit of claim 11, wherein:
    the RAM has a first side;
    the memory controller has a second side facing the first side of the RAM; and
    the routing unit is disposed between the first side of the RAM and the second side of the memory controller.

15. The printed circuit board unit of claim 11, further comprising:

a first wire unit connected to the RAM; and a second wire unit connected to the memory controller to be connected to the first wire unit though the sub wire unit of the routing unit.

16. The printed circuit board unit of claim 15, wherein:

the first wire unit is extended from the RAM toward the memory controller in a first direction;

the second wire unit is extended from the memory controller toward the first direction in a second direction; and the sub-wire unit is disposed in a sub direction parallel at least one of the first direction and the second direction.

17. The printed circuit board unit of claim 15, wherein:

the first wire unit is extended from the RAM;

the second wire unit is extended from the memory controller; and the sub-wire unit is disposed in a direction parallel to at least one of the first wire unit and the second wire unit to connect the first wire unit and the second wire unit.

18. The printed circuit board unit of claim 15, wherein:

the sub wire unit is formed in the routing unit in a direction parallel to at least one of the first wire unit and the second wire unit.

19. The printed circuit board unit of claim 15, wherein:

the sub wire unit is disposed on a straight line on which at least one of the first wire unit and the second wire unit is disposed.

20. The printed circuit board unit of claim 15, wherein:

the RAM comprises a first side from which the first wire unit is disposed;

the memory controller comprises a second side from which the second wire unit is disposed; and the first side of the RAM is disposed to face the second side of the memory controller.

21. The printed circuit board unit of claim 20, wherein:

the sub wire unit is disposed in the routing unit on a straight line between the first side of the RAM and the second side of the memory controller.

22. The printed circuit board unit of claim 15, further comprising:

one or more solder balls disposed between the sub wire unit and at least one of the first wire unit and the second wire unit, wherein the routing unit is spaced apart from the main board by a thickness of the solder balls to provide a second data transmission passage between a first component and a second component which are disposed on the main board.

23. The printed circuit board unit of claim 11, wherein:

the routing unit includes a body and terminals exposed from the body to the main board; and the sub wire unit is formed inside the body and connected between the terminals.

24. The printed circuit board unit of claim 23, wherein:

the body of the routing unit has a thickness between the sub wire unit and the main board as an insulation layer.

25. The printed circuit board unit of claim 23, wherein:

the routing unit forms a space with the main board as a second data transmission passage between a third component and a fourth component.

26. The printed circuit board unit of claim 25, wherein:

the data transmission passage is disposed in a direction having an angle with a direction of the second transmission passage.

27. The printed circuit board unit of claim 11, wherein:

the routing unit includes a body in which the sub wire unit is formed, the sub wire unit having a conductive line formed inside the body and terminals connected both ends of the conductive line and exposed from the body to an outside of the body; and the terminals are respectively connected to the RAM and the memory controller.

28. The printed circuit board unit of claim 27, wherein:

the conductive line is disposed parallel to a straight line connecting the RAM and the memory controller; and the terminals are extended from the conductive line toward terminals of the main board connected to the RAM and the memory controller.

* * * * *